United States Patent
Wu

(10) Patent No.: US 6,914,291 B2
(45) Date of Patent: Jul. 5, 2005

(54) SELF-ALIGNED FLOATING-GATE STRUCTURE FOR FLASH MEMORY DEVICE

(76) Inventor: Ching-Yuan Wu, 1F, No.20-1, Lane 281, Zhong Yang Rd., Hsinchu (TW)

(*) Notice: Subject to any disclaimer, the term of this patent is extended or adjusted under 35 U.S.C. 154(b) by 0 days.

(21) Appl. No.: 10/299,769

(22) Filed: Nov. 18, 2002

(65) Prior Publication Data

US 2004/0094795 A1 May 20, 2004

(51) Int. Cl.⁷ .............................. H01L 29/788

(52) U.S. Cl. ....................................... 257/317

(58) Field of Search ................. 257/314–326

(56) References Cited

U.S. PATENT DOCUMENTS

| | | | | |
|---|---|---|---|---|
| 3,758,794 A | * | 9/1973 | Kosonocky | .................. 377/63 |
| 5,635,415 A | * | 6/1997 | Hong | ......................... 438/261 |
| 6,171,909 B1 | * | 1/2001 | Ding et al. | ................. 438/267 |
| 6,576,537 B2 | * | 6/2003 | Tseng | ......................... 438/594 |
| 6,617,222 B1 | * | 9/2003 | Coursey | ..................... 438/398 |

OTHER PUBLICATIONS

Peter Van Zant, Microchip Fabrication:A practical guide to semiconductor processing, 2000, McGraw–Hill, New York, 4th dition, pp. 387*

* cited by examiner

Primary Examiner—Howard Weiss
Assistant Examiner—Marcos D. Pizarro
(74) Attorney, Agent, or Firm—Pro-Techtor International Services

(57) ABSTRACT

The self-aligned floating-gate structure with a high coupling ratio being formed by one masking photoresist step is disclosed by the present invention, which comprises a first conductive layer over a tunneling-dielectric layer being formed over a semiconductor substrate in an active region and two extended second conductive layers being separately formed over etched-back field-oxide layers in nearby STI regions. Each of the extended second conductive layers is defined by a sidewall dielectric spacer being formed over each sidewall of the active region for forming a first-type self-aligned floating-gate structure and is formed by a sidewall conductive spacer being formed over each sidewall of the active region for forming a second-type self-aligned floating-gate structure, wherein thin sidewall conductive spacers are formed over sidewalls of the extended second conductive layers to alleviate the corner field-emission effects.

10 Claims, 7 Drawing Sheets

SELF-ALIGNED FLOATING-GATE STRUCTURE FOR FLASH MEMORY DEVICE

BACKGROUND OF THE INVENTION

1. Field of the Invention

The present invention relates generally to a floating-gate structure of a non-volatile semiconductor memory device and, more particularly, to a self-aligned floating-gate structure having a high coupling ratio for flash memory device.

2. Description of Related Art

For a non-volatile semiconductor memory device, an efficient device isolation is required in order to eliminate the interference of nearby semiconductor devices. Basically, there are two kinds of device isolation Technologies: local oxidation of silicon (LOCOS) and shallow trench isolation (STI), in which the STI technology is often used for a minimum feature size smaller than 0.3 $\mu$m. For a non-volatile semiconductor memory device, a floating-gate layer is in general extended over nearby STI regions to increase the surface area of the floating-gate layer with respect to a control-gate layer in order to increase the coupling ration. For a NAND-type array, the coupling ratio of the floating-gate layer becomes a major factor to decrease the applied control-gate voltage for programming and erasing between the floating-gate layer and the semiconductor substrate. Therefore, the floating-gate structure is very important for a scaled NAND-type flash memory array.

FIG. 1 shows a method of forming a floating-gate structure for fabricating a high-density NAND-type array, as presented in a paper entitled "Advanced Flash Memory Technology and Trends for File Storage Application" published in IEEE IEDM 2000 Tech. Dig., pp. 763, in which a multilayer masking structure including from top to bottom a first masking silicon-nitride layer 103, a first polycrystalline-silicon layer 102, and a tunneling-oxide layer 101 is formed on a p-type semiconductor substrate 100 and is patterned by a first masking photoresist step (not shown) to form shallow trenches, as shown in FIG. 1A; a planarized field-oxide layer 104a is formed to fill up each gap between the patterned first masking silicon-nitride layers 103a by using chemical-mechanical polishing (CMP) and the first masking silicon-nitride layers 103a are then removed by anisotropic dry etching, and thereafter, a second polycrystalline-silicon layer 105 (not shown) is deposited and is then planarized by CMP to form a planarized second polycrystalline-silicon layer 105a, as shown in FIG. 1B; a second masking silicon-nitride layer 106 (not shown) is formed over the planarized second polycrystalline-silicon layer 105a and a second masking photoresist step (not shown) is then applied to pattern the second masking silicon-nitride layer 106, a sidewall silicon-nitride spacer 107a is then formed over each sidewall of the patterned second masking silicon-nitride layers 106a, and thereafter, the planarized second polycrystalline-silicon layer 105a between nearby sidewall silicon-nitride spacers 107a is removed, as shown in FIG. 1C; the patterned second masking silicon-nitride layers 106a and the sidewall silicon-nitride spacers 107a are selectively removed, an intergate-dielectric (ONO) layer 108 is then deposited over the planarized second polycrystalline-silicon layers 105b and the exposed planarized field-oxide layers 104a, a planarized third polycrystalline-silicon layer 109a is formed over the intergate-dielectric layer 108 by using CMP and subsequently, a tungsten-disilicide (WSi$_2$) layer 110 is formed over the planarized third polycrystalline-silicon layer 109a, as shown in FIG. 1D. It is clearly seen that two critical masking photoresist steps are required to form FIG. 1D, especially the second masking photoresist step is critical and will result in misalignment problem for each scaled flash cell. Moreover, two right corners of the planarized second polycrystalline-silicon layer 105a may result in reliability problems due to the corner field emission effect.

FIG. 2 shows another method of forming a floating-gate structure for fabricating a high-density NAND-type array, as presented in a paper entitled "a 0.15 $\mu$m NAND Flash Technology with 0.11 $\mu$m$^2$ Cell Size for 1 Gbit Flash memory" published in IEEE IEDM 2000 Tech. Dig., pp 767, in which a similar multilayer masking structure as FIG. 1A is formed over a p-type semiconductor substrate 100 and is patterned by a first masking photoresist step (non shown) to form shallow trenches, and a planarized field-oxide layer 104a is formed to fill up each gap between the patterned first masking silicon-nitride layers 103a, as shown in FIG. 2A; the patterned first masking silicon-nitride layers 103a are then removed by hot-phosphoric acid and a planarized second polycrystalline-silicon layer 111a (non shown) is formed over the patterned first polycrystalline-silicon layers 102a and the exposed planarized field-oxide layers 104a by using CMP, a second masking photoresist step (not shown) is applied to pattern the planarized second polycrystalline-silicon layer 111a and a anisotropic dry etching is performed to form the inclined shapes for the patterned second polycrystalline-silicon layers 111b, and thereafter, an intergate-dielectric layer (ONO) 112 is deposited over the patterned second polycrystalline-silicon layers 111b and the exposed planarized field-oxide layers 104a, as shown in FIG. 2B; and a planarized third polycrystalline-silicon layer 113a is formed over the intergate-dielectric layer 112 by using CMP and a tungsten-disilicide (WSi$_2$) layer 114 is then formed over the planarized third polycrystalline-silicon layer 113a, as shown in FIG. 2C. It is clearly seen from FIG. 2C that two critical masking photoresist steps are also required, the second masking photoresist step is also critical, and misalignment is inevitable. Moreover, although two corners of the patterned second conductive layer 111b are inclined, but the corner field-emission effect is inevitable.

It is, therefore, a major objective of the present invention to offer a self-aligned STI structure having a self-aligned floating-gate structure with a high coupling ratio by using only one masking photoresist step.

SUMMARY OF THE INVENTION

A self-aligned floating-gate structure with a high coupling ratio being fabricated by using only one masking photoresist step is disclosed by the present invention. A multilayer masking structure comprising from top to bottom a masking dielectric layer, a first conductive layer, and a tunneling-dielectric layer is formed over a semiconductor substrate of a first conductivity type and is patterned to form a plurality of STI regions by using the masking photoresist step. Each of the plurality of STI regions is filled with a planarized field-oxide layer and the planarized field-oxide layers are selectively etched back to a depth approximately equal to a middle level of the patterned first conductive layer to form etched-back field-oxide layers. A planarized second conductive layer is formed over the etched-back field-oxide layer in each of the plurality of STI regions and is etched back to a predetermined thickness, a pair of sidewall dielectric spacers are formed over sidewalls of nearby patterned masking dielectric layers and on a portion of the etched-back planted second conductive layer in each of the plurality of STI regions, the etched-back planarized second conductive layer between the pair of sidewall dielectric spacers is removed by using anisotropic dry etching to form extended second conductive layers, the patterned masking dielectric layers and the pair of sidewall dielectric spacers are selectively removed, and thin sidewall conductive spacers are formed over sidewalls of each of the extended second conductive layers to form a first-type self-aligned floating-gate structure. A pair of sidewall conductive spacers are formed over sidewalls of nearby patterned masking dielectric layers and on a portion of the etched-back field-oxide layer in each of the plurality of STI regions, the patterned masking dielectric layers are selectively removed, and thin sidewall conductive spacers are formed over sidewalls of the pair of sidewall conductive spacers to form a second-type self-aligned floating-gate structure. An intergate-dielectric layer is formed over the first/second-type floating-gate structure, a planarized third conductive layer is formed over the intergate-dielectric layer, and a capping conductive layer is then formed over the planarized third conductive layer to form a composite control-gate layer. The advantages and features of the self-aligned floating-gate structure of the present invention are: one masking photoresist step required, a higher coupling ratio, no misalignment problem, and alleviated corner field-emission effect.

DETAILED DESCRIPTION OF THE PREFERRED EMBODIMENTS

Referring now to FIG. 3A through FIG. 3F, there are shown the process steps and their cross-sectional views for form a self-aligned shallow-trench-isolation (STI) structure having a first-type floating-gate structure of the present invention.

Figure 1A:
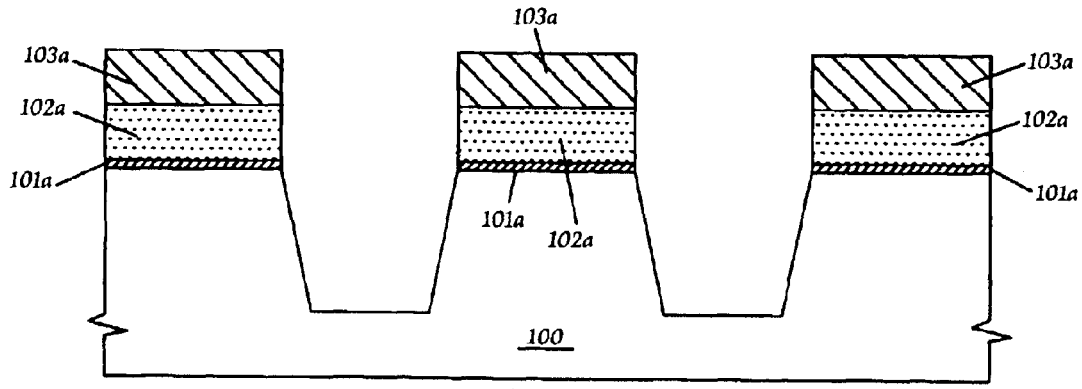
FIG. 1A through FIG. 1D show the process steps and their cross-sectional views of fabricating a STI structure having a non-self-aligned floating-gate structure as presented by a first prior art.
Figure 1B:
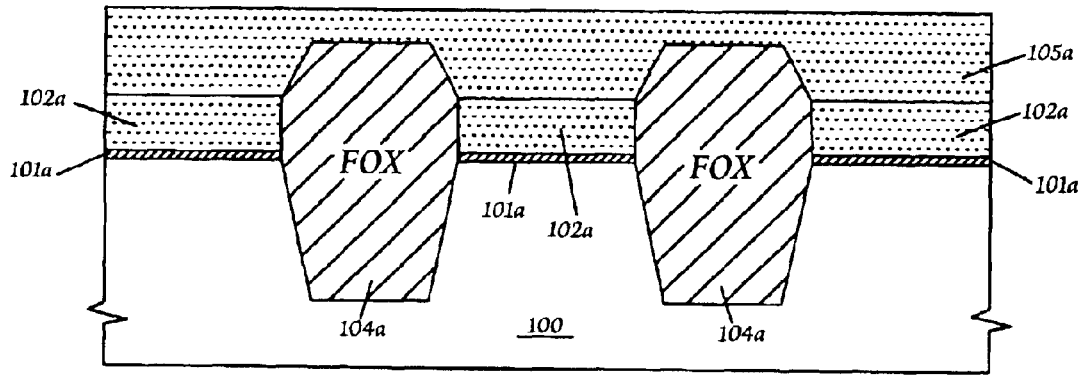
Figure 1C:
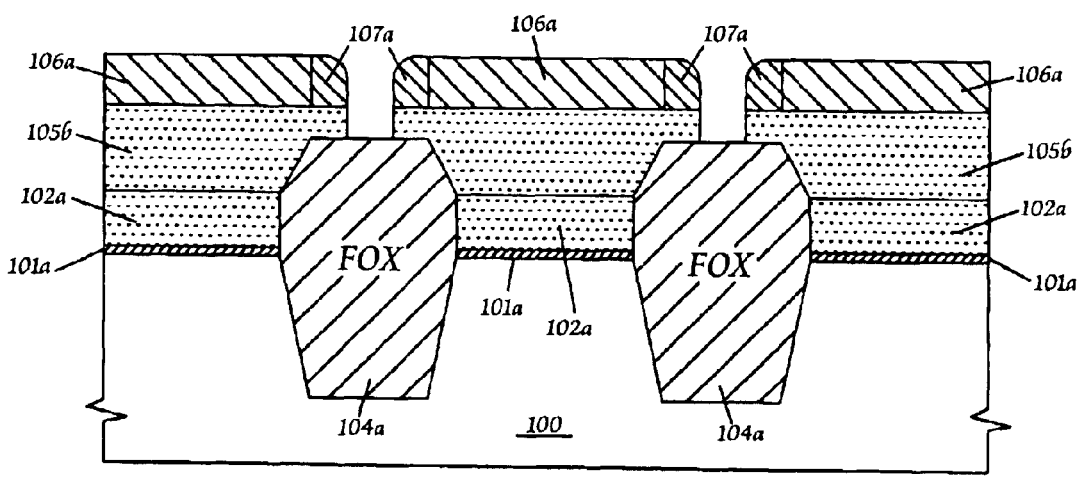
Figure 1D:
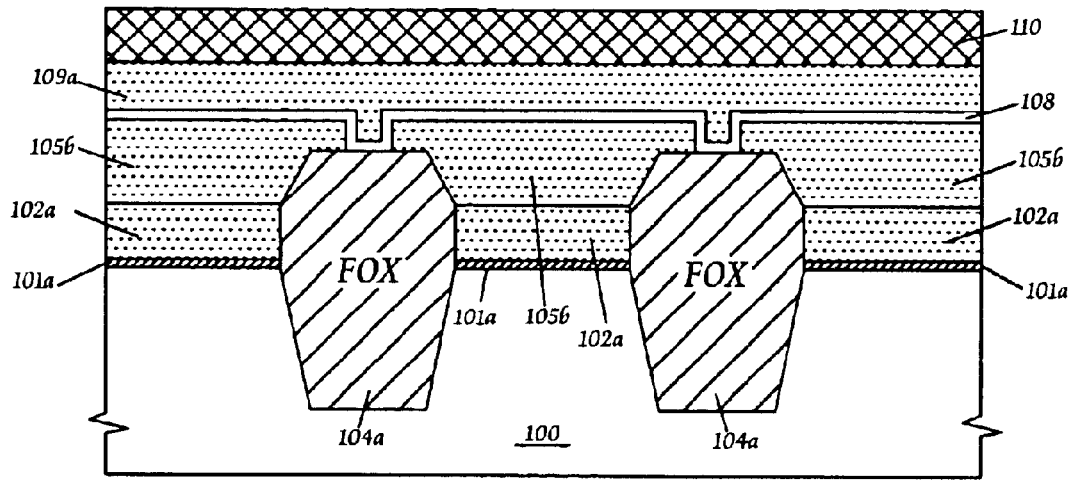
Figure 2A:
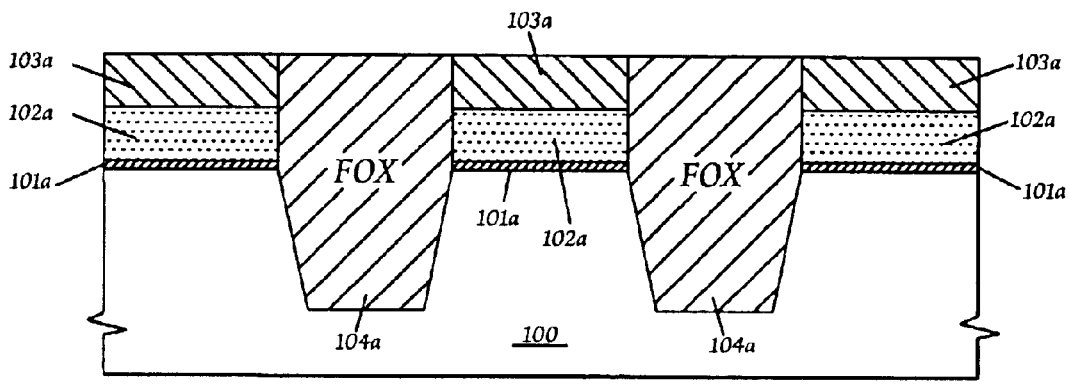
FIG. 2A through FIG. 2C show the process steps and their cross-sectional views of fabricating a STI structure having a non-self-aligned floating-gate structure as presented by a second prior art.
Figure 2B:
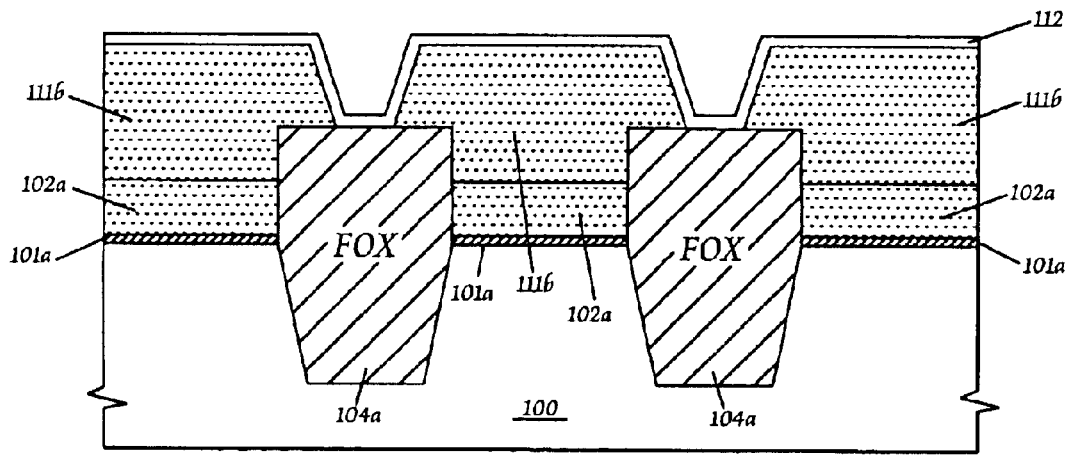
Figure 2C:
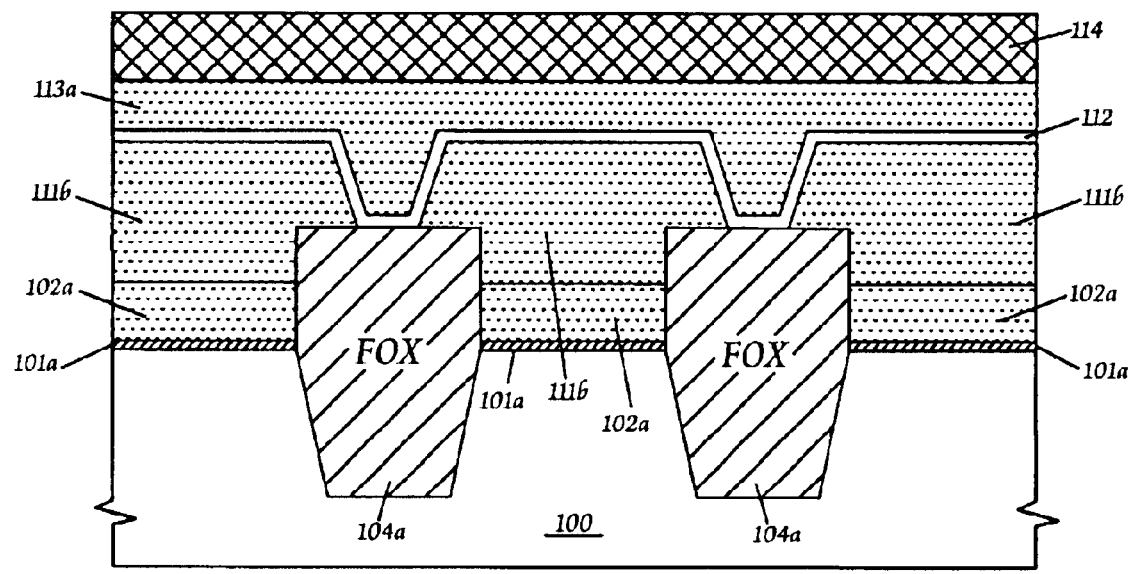
Figure 3A:
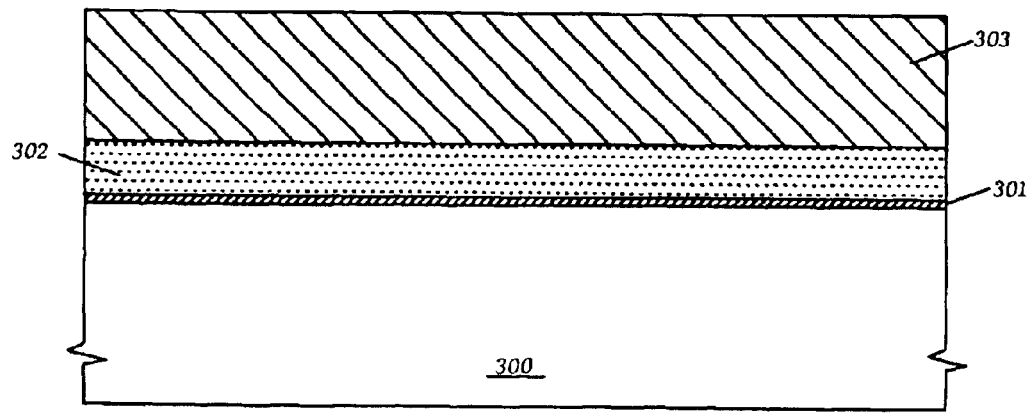
FIG. 3A through FIG. 3F show the process steps and their cross-sectional views of fabricating a self-aligned STI structure having a first-type self-aligned floating-gate structure of the present invention.

FIG. 3A shows that a tunneling-dielectric layer 301 is formed over a semiconductor substrate 300 of a first conductivity type; a first conductive layer 302 is formed over the tunneling-dielectric layer 301; and a masking dielectric layer 303 is formed over the first conductive layer 302 to form a first multilayer masking structure. The tunneling-dielectric layer 301 is preferably made of a thermal silicon-dioxide layer or a nitrided thermal silicon-dioxide layer and its thickness is preferably between 70 Angstroms and 120 Angstroms. The first conductive layer 302 is preferably made of doped polycrystalline-silicon or doped amorphous-silicon as deposited by low pressure chemical vapor deposition (LPCVD) and its thickness is preferably between 1000 Angstroms and 5000 Angstroms. The masking dielectric layer 303 is preferably made of silicon nitride as deposited by LPCVD and its thickness is preferably between 2000 Angstroms and 7000 Angstroms.

Figure 3B:
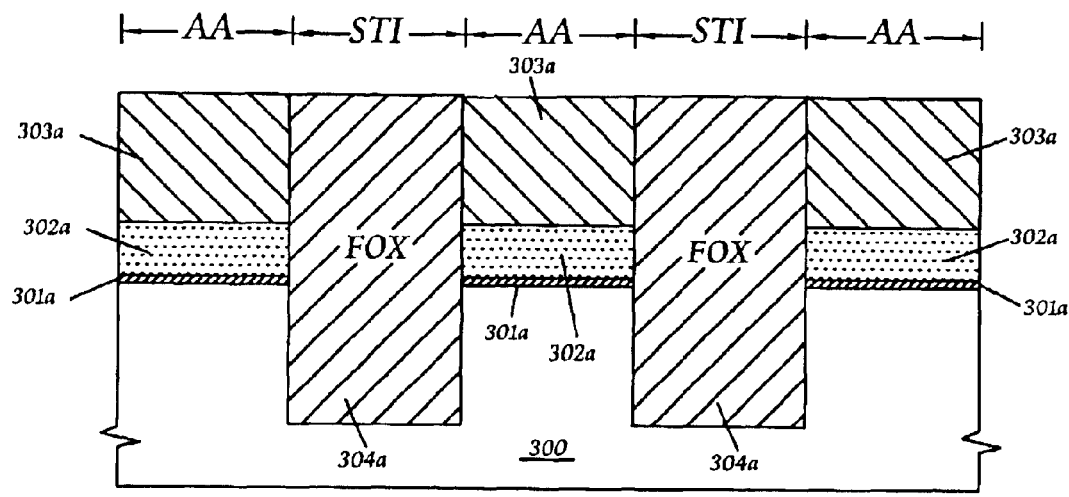

FIG. 3B shows that the first multilayer masking structure is patterned by a masking photoresist step (PR1) (not shown) to form a plurality of parallel STI regions by sequentially removing the masking dielectric layers 303, the first conductive layers 302, the tunneling-dielectric layers 301, and etching the semiconductor substrate 300 to form a plurality of shallow trenches; a planarized field-oxide layer 304a is formed to fill up each gap between the patterned masking dielectric layers 303a. The depth of the shallow trenches in the semiconductor substrate 300 is preferably between 3000 Angstroms and 7000 Angstroms. The planarized field-oxide layer 304a is preferably made of silicon-dioxide, phosphorous-silicate glass (p-glass) or borophosphorous-silicate glass (BP-glass) as deposited by LPCVD, high density plasma (HDP) CVD, or plasma-enhanced (PE) CVD, and is formed by first depositing a thick oxide film 304 (not shown) to fill up each gap formed between the patterned masking dielectric layers 303a and then planarizing the deposited thick oxide film 304 by using chemical mechanical polishing (CMP) with the patterned masking dielectric layer 303a as a polishing stop. The masking photoresist step comprises a plurality of masking photoresist PR1 being forming over the masking dielectric layer 303 or a plurality of masking photoresist PR1 over an anti-reflection coating (ARC) layer being formed over the masking dielectric layer 303. It should be noted that the width of the STI regions (STI) and the width of the active regions (AA) can be defied to be the minimum feature size of technology used.

Figure 3C:
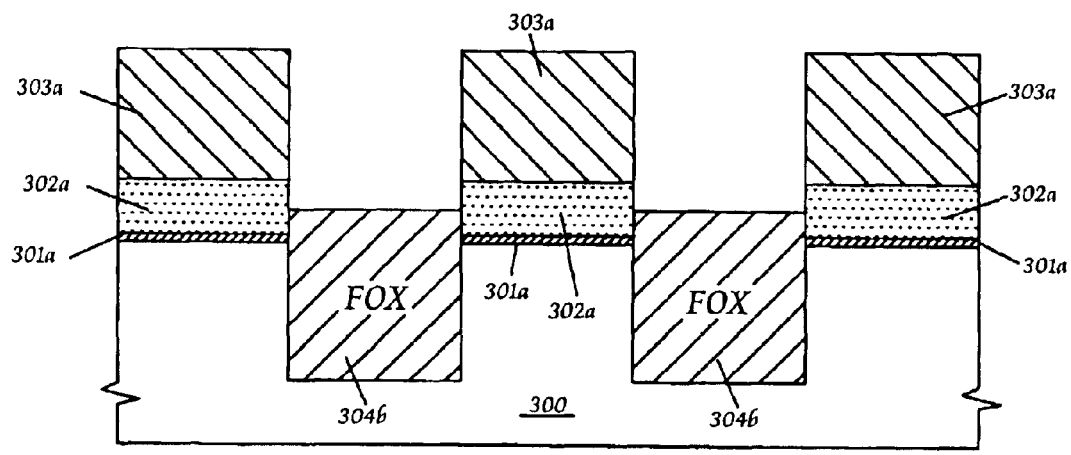

FIG. 3C shows that the planarized field-oxide layers 304a in the STI regions are selectively etched back to a depth approximately equal to a middle level of the first conductive layer 302a by using anisotropic dry etching or wet-chemical etching to form etched-back field-oxide layers 304b.

Figure 3D:
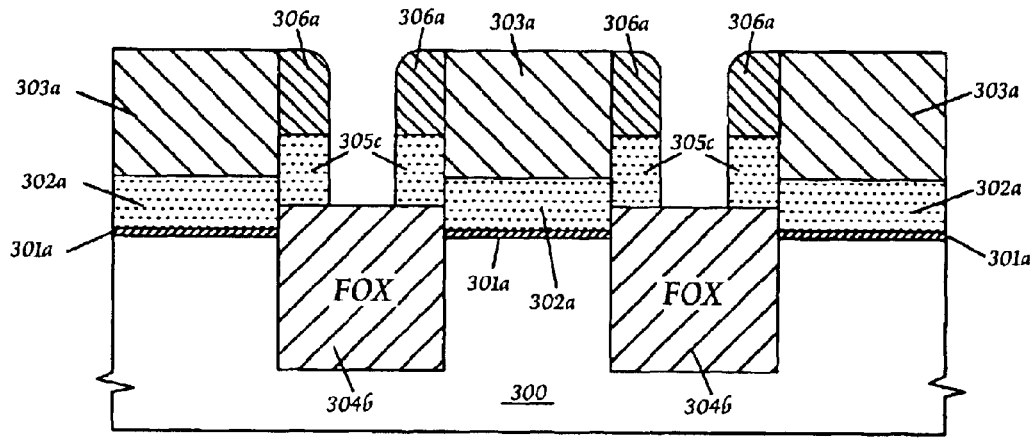

FIG. 3D shows that an etched-back planarized second conductive layer 305b (not shown) is formed over each of the etched-back field-oxide layers 304b; a pair of sidewall dielectric spacers 306a are formed over sidewalls of nearby patterned masking dielectric layers 303a and on a portion of the etched-back planarized second conductive layer 305b in each of the STI regions; and the etched-back planarized second conductive layers 305b between the pair of sidewall dielectric spacers 306a are removed. The etched-back planarized second conductive layer 305b is preferably made of doped polycrystalline-silicon or doped amorphous-silicon as deposited by LPCVD and is formed by first depositing a thick second conductive film 305 (not shown) to fill up each gap formed in the STI regions, then planarizing the deposited second conductive film 305 using CMP with the patterned masking dielectric layer 303a as a polishing stop, and thereafter etching back the planarized second conductive layers 305a (not shown). The sidewall dielectric spacer 306a is preferably made of silicon-nitride as deposited by LPCVD and is formed by first depositing a silicon-nitride layer 306 (not shown) over a formed structure surface and then etching back a thickness of the deposited silicon-nitride layer 306. Therefore, the spacer width of the sidewall dielectric spacers 306a is mainly controlled by the thickness of the deposited silicon-nitride layer 306.

Figure 3E:
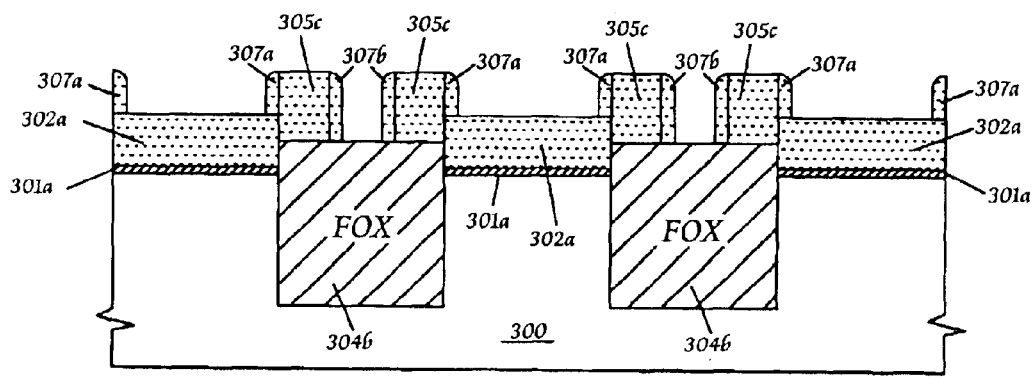

FIG. 3E shows that the patterned masking dielectric layers 303a and the pair of sidewall dielectric spacers 306a are selectively removed by using hot-phosphoric acid and thin sidewall conductive spacers 307a, 307b are formed over sidewalls of the extended second conductive layers 305c. The thin sidewall conductive spacers 307a, 307b are preferably made of doped polycrystalline-silicon or doped amorphous-silicon as deposited by LPCVD and are formed by first depositing a thin conductive layer 307 (not shown) over a formed structure surface and then etching back a thickness of the deposited thin conductive layer 307. It should be noted that the thin sidewall conductive spacers 307a, 307b are mainly used to round up the sharp corners produced by the extended second conductive layers 305c, so the data retention problem due to the field emission effect of the sharp corners can be alleviated.

Figure 3F:
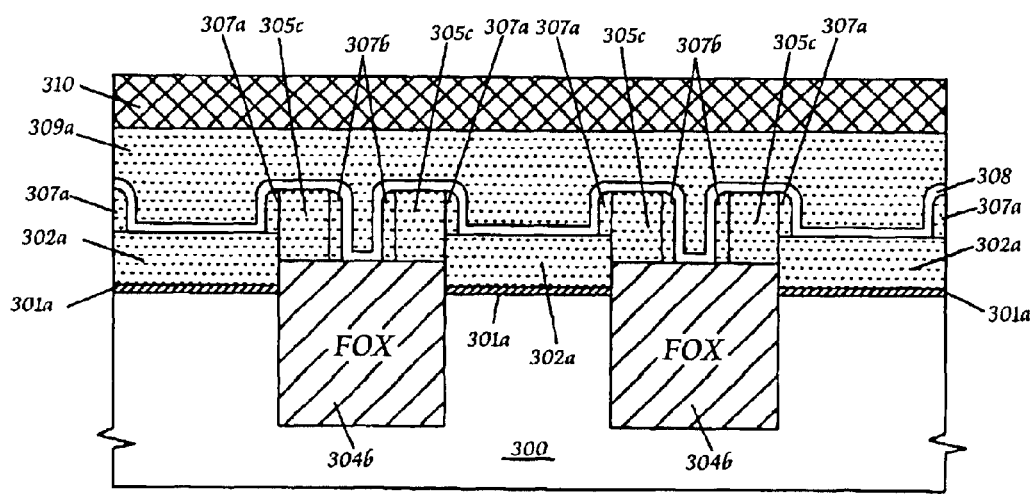

FIG. 3F shows that an intergate-dielectric layer 308 is formed over a formed structure surface shown in FIG. 3E; a planarized third conductive layer 309a is then formed over the intergate dielectric layer 308; and subsequently, a capping conductive layer 310 is formed over the planarized third conductive layer 309a. The intergate dielectric layer 308 is preferable an oxide-nitride-oxide (ONO) layer or a nitride-oxide (NO) layer and its equivalent oxide thickness is preferably between 70 Angstroms and 120 Angstroms. The planarized third conductive layer 309a is preferably made of doped polycrystalline-silicon or doped amorphous-silicon as deposited by LPCVD and is formed by first depositing a thick third conductive layer 309 (not shown) over the intergate-dielectric layer 308 and then planarizing the deposited thick third conductive layer 309 using CMP or etching-back technique. The capping conductive layer 310 is preferably made of tungsten-disilicide ($WSi_2$) or tungsten (W) as deposited by LPCVD and sputtering.

From FIG. 3A through FIG. 3F, it is clearly seen that a single masking photoresist step is required to form a self-aligned STI structure having a self-aligned floating-gate structure with a high coupling ratio and the sharp corners of the self-aligned floating-gate structure are smoothed by forming the thin sidewall conductive spacers 307a, 307b.

Referring now to FIG. 4A through FIG. 4E, there are shown the process steps and their cross-sectional views of forming a self-aligned STI structure having a second-type self-aligned floating-gate structure of the present invention.

Figure 4A:
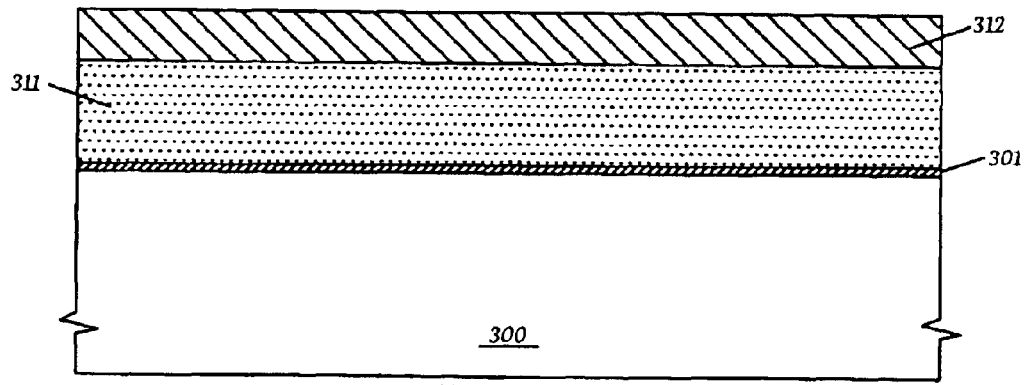
FIG. 4A through FIG. 4E show the process steps and their cross-sectional views of fabricating a self-aligned STI structure having a second-type self-aligned floating-gate structure of the present invention.

FIG. 4A shows that a multilayer masking structure, including, from top to bottom, a masking dielectric layer 312, a first conductive layer 311, and a tunneling-dielectric layer 301, is formed over a semiconductor substrate 300 of a first conductivity type. The tunneling-dielectric layer 301 is the same as that shown in FIG. 3A through FIG. 3F. However, the first conductive layer 311 is relatively thicker than that shown in FIG. 3A through FIG. 3F, and the masking dielectric layer 312 is relatively thinner than that shown in FIG. 3A through FIG. 3F. The preferable thickness of the first conductive layer 311 is between 3000 Angstroms and 8000 Angstroms and the preferable thickness of the masking dielectric layer 312 is between 1000 Angstroms and 4000 Angstroms.

Figure 4B:
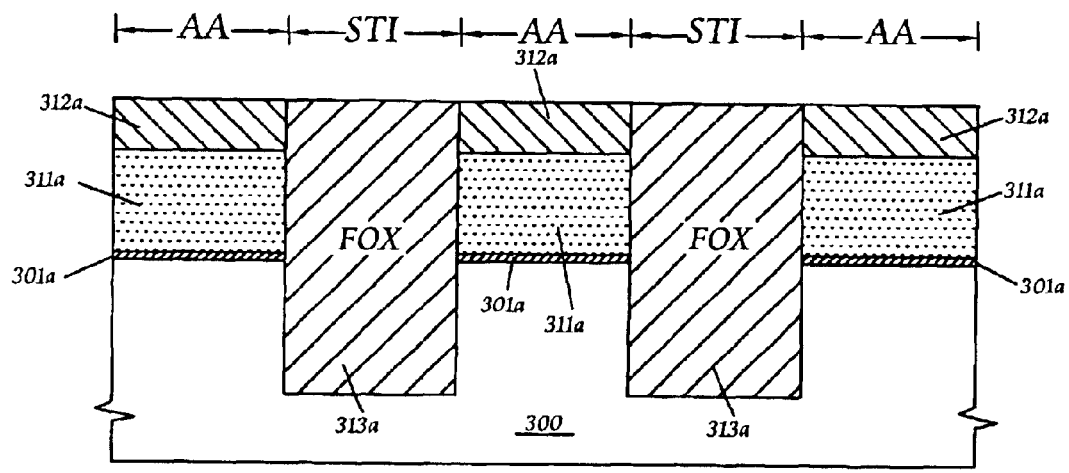

FIG. 4B shows that the multilayer masking structure is patterned by a masking photoresist step as described in FIG. 3B to form a plurality of STI regions and a planarized field-oxide layer 313a is formed to fill up each gap between the patterned masking dielectric layers 312a by using CMP, as described in FIG. 3B. Similarly, the width of the STI regions (STI) and the width of the active regions (AA) can be defined to be the minimum feature size (F) of technology used.

Figure 4C:
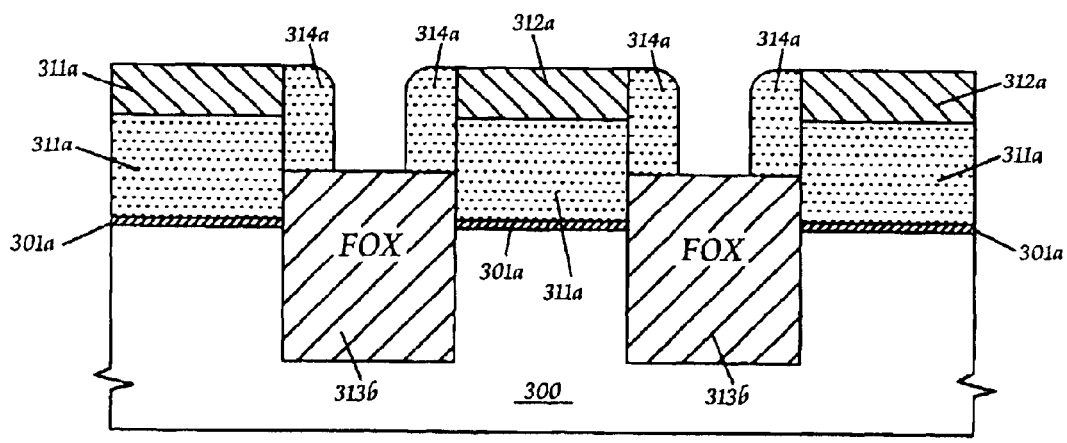

FIG. 4C shows that the planarized field-oxide layers 313a are selectively etched back so a depth approximately equal to a middle level of the first conductive layer 311a by using anisotropic dry etching or wet-chemical etching, and a pair of first sidewall conductive spacers 314a are formed over a portion of the etched-back planarized field-oxide layer 313b in each of the STI regions and over sidewalls formed by the patterned masking dielectric layers 312a aver the first conductive layer 311a. The first sidewall conductive spacer 314a is preferably made of doped polycrystalline-silicon or doped amorphous-silicon as deposited by LPCVD, and is formed by first depositing a second conductive layer 314 (not shown) over a formed structure surface and then etching back a thickness of the deposited second conductive layer 314. Therefore, the space between the pair of first sidewall conductive spacers 314a can be easily controlled by the thickness of the deposited second conductive layer 314.

Figure 4D:
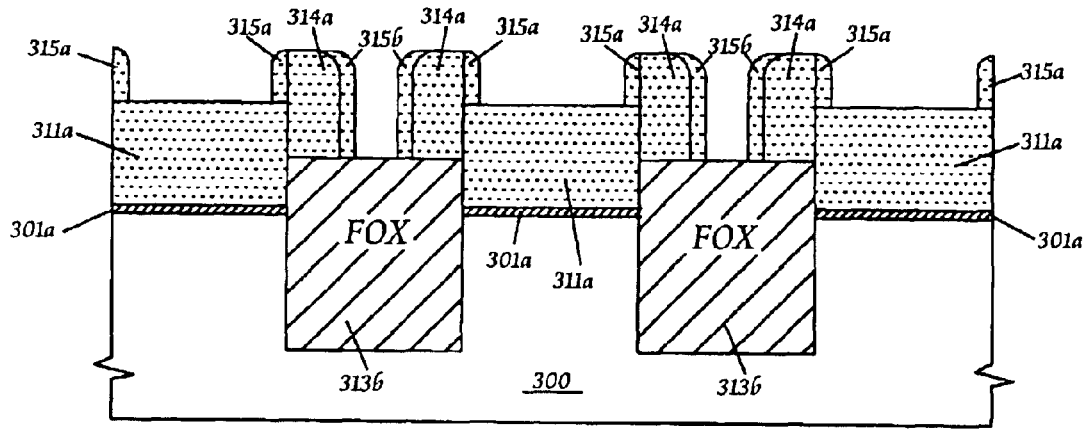

FIG. 4D shows that the patterned masking dielectric layers 312a are selectively removed by hot-phosphoric acid or anisotropic dry etching, and second sidewall conductive spacers 315a, 315b are formed over sidewalls of the first sidewall conductive spacers 314a. The second sidewall conductive spacers 315a, 315b are preferably made of doped amorphous-silicon or doped polycrystalline-silicon as deposited by LPCVD, and are formed by first depositing a thin conductive layer 315 (not shown) over a formed structure surface and then etching back a thickness of the deposited thin third conductive layer 315. It is clearly seen that the second sidewall conductive spacer 315a is used to round up a sharp corner of the first sidewall conductive spacer 314a in order to alleviate the field-emission effect of the sharp corner. It should be emphasized that the spacer widths of the first sidewall conductive spacers 314a and the second sidewall conductive spacers 315b, 315a can be adjustable, but the major constraints are that the space between the second sidewall conductive spacers 315b must be at least larger than two times of a thickness of the intergate-dielectric layer 316 as shown in FIG. 4E and the surface area of the self-aligned floating-gate structure is optimized to offer a largest coupling ratio for the given thicknesses of the masking dielectric layer 312 and the first conductive layer 311.

Figure 4E:
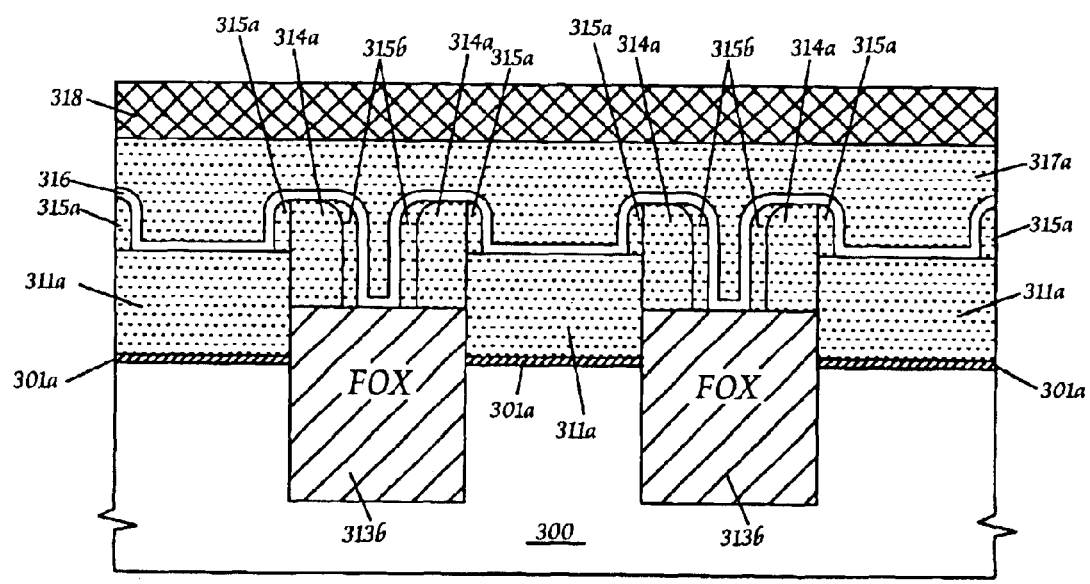

FIG. 4E shows that an intergate dielectric layer 316 is formed over a formed structure surface; a planarized conductive layer 317a is formed over the intergate-dielectric layer 316; and subsequently, a capping conductive layer 318 is formed over the planarized conductive layer 317a. The planarized conductive layer 317a is preferably made of doped polycrystalline-silicon or doped amorphous-silicon as deposited by LPCVD, and is formed by the same method as described in FIG. 3F. Similarly, the capping conductive layer 318 is preferably made of tungsten-disilicide ($WSi_2$) or tungsten (W) as deposited by LPCVD or sputtering.

From FIG. 4A through FIG. 4E, it is also clearly seen that a single masking photoresist step is required to offer a self-aligned STI structure having a self-aligned floating-gate structure with a high coupling ratio. Moreover, the process steps are much simpler and the sharp corners in the self-aligned floating-gate structure are smoothed by sidewall conductive spacers 315a, 315b.

Accordingly, the self-aligned STI structure having a self-aligned floating-gate structure of the present invention offers the following advantages and features:

(a) The self-aligned floating-gate structure of the present invention can be easily fabricated by a single masking photoresist step as compared to two masking photoresist steps of the prior arts.

(b) The self-aligned floating-gate structure of the present invention offers a higher coupling ratio as compared to the prior arts.

(c) The self-aligned floating-gate structure of the present invention may offer higher data retention and reliability as compared to the prior arts because the sharp corners in the self-aligned floating-gate layer of the preserve invention are smoothed by forming sidewall conductive spacers.

(d) The self-aligned floating-gate structure of the present invention can be scaled to have a smaller minimum feature size of technology used without concerning misalignment in forming the self-aligned floating-gate structure, as compared to the non-self-aligned floating-gate structure of the prior arts.

While the present invention has been particularly shown and described with reference to the present examples and embodiments as considered as illustrative and not restrictive. Moreover, the present invention is not to be limited to the details given herein, it will be understood by those skilled in the art that various changes in forms and details may be made without departure from the true spirit and scope of the present invention.

What is claimed is:

1. A self-aligned floating-gate structure, comprising:

a semiconductor substrate of a first conductivity type;

a plurality of shallow-trench-isolation (STI) regions and a plurality of active regions being formed alternately on said semiconductor substrate, wherein each of the plurality of active regions comprises a first conductive layer over a tunneling-dielectric layer being formed over said semiconductor substrate and each of the plurality of STI regions comprises an etched-back field-oxide layer and a pair of extended second conductive layers being formed on side and top portions of said etched-back field-oxide layer;

a thin sidewall conductive spacer being formed over each sidewall of said extended second conductive layers to form a plurality of self-aligned floating-gate layers;

an intergate-dielectric layer being formed over a surface formed by the plurality of self-aligned floating-gate layers and said etched-back field-oxide layer between nearby self-aligned floating-gate layers;

a planarized third conductive layer being formed over said intergate-dielectric layer; and a capping conductive layer being formed over said planarized third conductive layer.

2. The self-aligned floating-gate structure according to claim 1, wherein said semiconductor substrate is a p-type substrate or a p-type well.

3. The self-aligned floating-gate structure according to claim 1, wherein said tunneling-dielectric layer is a thermal silicon-dioxide layer or a nitrided thermal silicon-dioxide layer and its thickness is between 70 Angstroms and 120 Angstroms.

4. The self-aligned floating-gate structure according to claim 1, wherein said pair of extended second conductive layers are defined by a pair of sidewall dielectric spacers being formed over sidewalls of nearby active regions and on a portion of an etched-back second conductive layer being formed over said etched-back field-oxide layer in each of the plurality of STI regions.

5. The self-aligned floating-gate structure according to claim 1, wherein said pair of extended second conductive layers are formed by a pair of sidewall conductive spacers being formed over sidewalls of nearby active regions and on a portion of etched-back field-oxide layer in each of the plurality of STI regions.

6. The self-aligned floating-gate structure according to claim 1, wherein said first conductive layer is made of doped polycrystalline-silicon or doped amorphous-silicon as deposited by LPCVD.

7. The self-aligned floating-gate structure according to claim 1, wherein said extended second conductive layer is made of doped polycrystalline-silicon or doped amorphous-silicon as deposited by LPCVD.

8. The self-aligned floating-gate structure according to claim 1, wherein said thin sidewall conductive spacer is made of doped polycrystalline-silicon or doped amorphous-silicon as deposited by LPCVD.

9. The self-aligned floating-gate structure according to claim 1, wherein said intergate-dielectric layer is an oxide-nitride-oxide (ONO) layer or a nitride-oxide (NO) layer and its equivalent oxide thickness is between 70 Angstroms and 120 Angstroms.

10. The self-aligned floating-gate structure according to claim 1, wherein said planarized third conductive layer is made of doped polycrystalline-silicon or doped amorphous-silicon as deposited by LPCVD and said capping conductive layer is made of tungsten-disilicide ($WSi_2$) or tungsten (W) as deposited by LPCVD or sputtering.

\* \* \* \* \*